(12) United States Patent
Karanko et al.

(10) Patent No.: US 8,131,521 B1
(45) Date of Patent: Mar. 6, 2012

(54) BLOCK SPECIFIC HARMONIC BALANCE ANALYSIS SYSTEM

(75) Inventors: Ville Pekka Ilmari Karanko, Espoo (FI); Taisto Veeti Kullervo Tinttunen, Helsinki (FI); Jarmo Ensio Virtanen, Espoo (FI)

(73) Assignee: AWR-APLAC Oy, Espoo (FI)

( * ) Notice: Subject to any disclaimer, the term of this patent is extended or adjusted under 35 U.S.C. 154(b) by 386 days.

(21) Appl. No.: 12/315,451

(22) Filed: Dec. 3, 2008

Related U.S. Application Data

(60) Provisional application No. 61/135,519, filed on Jul. 21, 2008.

(51) Int. Cl.
*G06F 17/50* (2006.01)
(52) U.S. Cl. .................... 703/2; 703/6; 703/17
(58) Field of Classification Search .............. 703/14, 703/17, 2, 6; 716/115, 136
See application file for complete search history.

(56) References Cited

U.S. PATENT DOCUMENTS

| | | | | |
|---|---|---|---|---|
| 5,867,416 | A * | 2/1999 | Feldmann et al. | 708/801 |
| 6,154,716 | A * | 11/2000 | Lee | 703/2 |
| 6,182,270 | B1 * | 1/2001 | Feldmann et al. | 716/136 |
| 7,007,253 | B2 * | 2/2006 | Gullapalli et al. | 716/115 |
| 7,035,782 | B2 * | 4/2006 | Yang et al. | 703/14 |
| 2003/0046045 | A1 * | 3/2003 | Pileggi et al. | 703/4 |
| 2003/0144824 | A1 * | 7/2003 | Yang et al. | 703/14 |

* cited by examiner

*Primary Examiner* — Thai Phan

(57) ABSTRACT

This invention is directed to a circuit simulation using multi-rate harmonic balancing. Specifically, this invention enables effective reduction of analysis dimensions, e.g. frequency or time. The methodology converts N-dimensional problems to local (N-x)-dimensional problems. The method enables simultaneous solving of all local problems, each of these problems having a dimension less than or equal to N, thus approximating the original system to be solved. In practical situations, N could be the number of independent frequencies in an N-tone harmonic balance analysis.

33 Claims, 11 Drawing Sheets

BLOCK SPECIFIC HARMONIC BALANCE ANALYSIS SYSTEM

CLAIM OF PRIORITY

This application claims priority to U.S. Provisional Patent Application No. 61/135,519 filed on Jul. 21, 2008 titled "Block Specific Harmonic Balance System Simulator" and is incorporated by reference.

BACKGROUND OF THE INVENTION

1. Field of the Invention

This invention provides a block specific harmonic balance simulator for use with electronic design automation ("EDA") tools used in radio frequency circuit designs. Specifically, this invention relates to the simplification of frequency-domain analysis in the design of radio frequency circuit designs by using harmonic balance method thus reducing the number of frequencies used during in an electrical system simulation.

2. Related Art

As the complexity, efficiency and robustness requirements in electrical devices such as mobile phones, satellite receivers and wireless local area networks increase, more efficient and accurate circuit design of such devices are required. To reduce product development schedules and make the design work as efficient as possible, it is important to automate the design of the circuitry. This design work is often performed by simulation computers and associated software where the circuitry design is stored into the memory of a computer as a virtual representation.

Circuit design typically involves several steps. Usually the design starts with some schematic representation of the circuit that can then be simulated by circuit designers to observe and manipulate the behavior of the design in order to increase robustness of the design and optimize its performance. When the design on a schematic level works, a layout of the circuit may be produced.

Present methodologies in circuit design analysis that are in use in circuit simulation software analyze the behavior of electric circuitry either in the frequency domain or in the time domain. The designer considers the circuit as a whole and applies the same algorithm throughout the computer representation of the electric circuit under evaluation. This methodology may present particular problems with the frequency domain nonlinear steady-state method, harmonic balance that is almost invariably used in the electrical engineering community to simulate the behavior of the electronic circuits designed in the frequency domain. To one skilled in the art of electronic circuit design, the engineering process of designing an electronic circuitry will need to consider overall systems comprising smaller subsystems where each may have very different modes of operation. These subsystems may have states or modes of operation that are not shared by the other subsystems.

In prior art systems, the circuit designer inputs data instructions to the system or circuit simulator computer system. The design process followed by circuit designers is typically a structured process where any outcome of the process is derived from analysis of subsystems or sub-circuits that are to an extent designed separately. The completion of the design process typically requires verification of correctness of operation of the overall system completed by joining the subsystems together. If such a verification or additional design is accomplished by a circuit simulator, the knowledge from the previous steps of the design process can be used to represent the computational representation of the entire system. However, this is not accomplished to full extent by prior art simulators. Most importantly, present day harmonic balance simulators and other steady state circuit simulators and their derivatives do not allow the circuit designer to specify that some modes of operation are not present or are unimportant for the physical behavior of each sub-circuit. Therefore, such knowledge would be potentially useful for the whole system simulation that is currently unavailable in prior art systems creating serious shortcomings in prior art circuit simulators.

Also in prior art systems, the harmonic balance methodology for steady state simulation, or derivatives and enhancements of such steady state methods, the analysis methodology uses the same parameters applied to each and every sub-system. In many present day engineering problems such as those in the field of radio frequency integrated circuit design, some subsystems may include a large number of operational modes that are needed to be included in a computer representation of that particular subsystem, but are not shared by other subsystems. If the modes of operation are still unnecessarily included in the computer representation of the other subsystems, a serious inefficiency will arise and the time required for the analysis process and use of computer memory will be prohibitively large for the simulation analysis to be practical to a circuit designer.

SUMMARY

This invention is directed to an electrical system simulation using multi-rate harmonic balance analysis. Specifically, this invention enables effective reduction of analysis dimensions, e.g. frequency or time. The methodology converts N-dimensional problems to local (N-x)-dimensional problems. The method enables simultaneous solving of all local problems, each of these problems having a dimension less than or equal to N, thus approximating the original system to be solved. In practical situations, N could be the number of independent frequencies in an N-tone harmonic balance analysis.

The methodology circumvents the problems related to large dimensions that are typically associated in the field of numerical mathematics and it enables simulations of large systems and makes it possible to solve select parts of the circuit with increased accuracy. The presented analysis method is one of the first methodologies capable of simulating a circuit level system with several independent fundamental frequencies. For example, solving a large circuit having more than four fundamental frequencies is complex. The methodology using a multi-rate harmonic balance reduces the number of frequencies used in the analysis thus decreasing the computational complexity of the simulation.

Other systems, methods, features, and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DETAILED DESCRIPTION OF THE DRAWINGS

The components in the figures are not necessarily to scale, emphasis being placed instead upon illustrating the principles of the invention. In the figures, like reference numerals designate corresponding parts throughout the different views.

DETAILED DESCRIPTION

Figure 1:
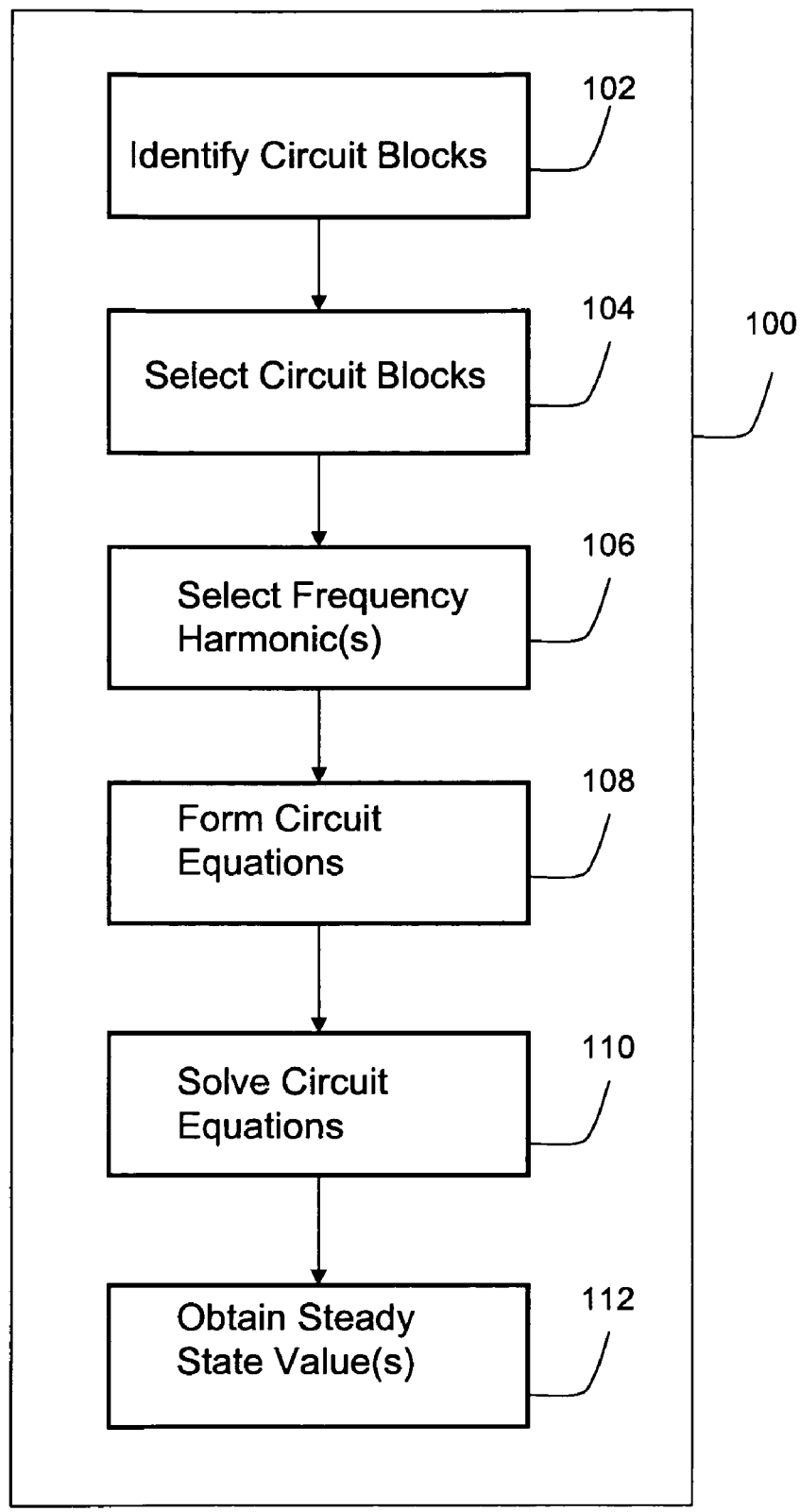
FIG. 1 is a flow chart illustrating the steps in a harmonic balance simulation.

FIG. 1 illustrated the steps of the harmonic balance simulation on a computer 100. First, the simulator tool identifies the circuit block 102. Next, the user selects the blocks 104. This can be accomplished manually by a user of the simulation software or by parameters selected by the user so that the simulation software employs a frequency selection tool to select the list of blocks. The frequency selection tool may select the blocks manually by the user, by establishing initial values of oversampling the nonlinear elements of the frequency, by using a result from a previous simulation, or by automatically based error estimation during an iterative process by the simulation.

The user may also refine the selection of the blocks to obtain a desired list of blocks for the simulation. This refinement of the block selection may be accomplished by trading off speed of the circuit simulator with memory consumption to obtain the optimal block selection.

The user then selects the frequency harmonic(s) 106 that will be used during the simulation. The frequency selection may be accomplished by using harmonic balance effectively reducing the analysis dimensions, e.g. frequency or time. This methodology converts N-dimensional problems to local (N-x)-dimensional problems and enables simultaneous solving of all local problems with each of these problems having a dimension less than or equal to N. Thus, approximation to the original system can be efficiently solved. Here, N could be the number of independent frequencies in an N-tone harmonic balance analysis. In the alternative, the frequency selection may be accomplished by frequency domain steady state.

Next, the simulator software creates the circuit equations 108 and solves the equations 110. From the circuit equations 108, the simulator can obtain steady state value(s) 112 for voltage, current, power, etc. As an alternative, the simulator may provide a Jacobian matrix that includes information on current derivatives at the location of at least one node.

Figure 2:
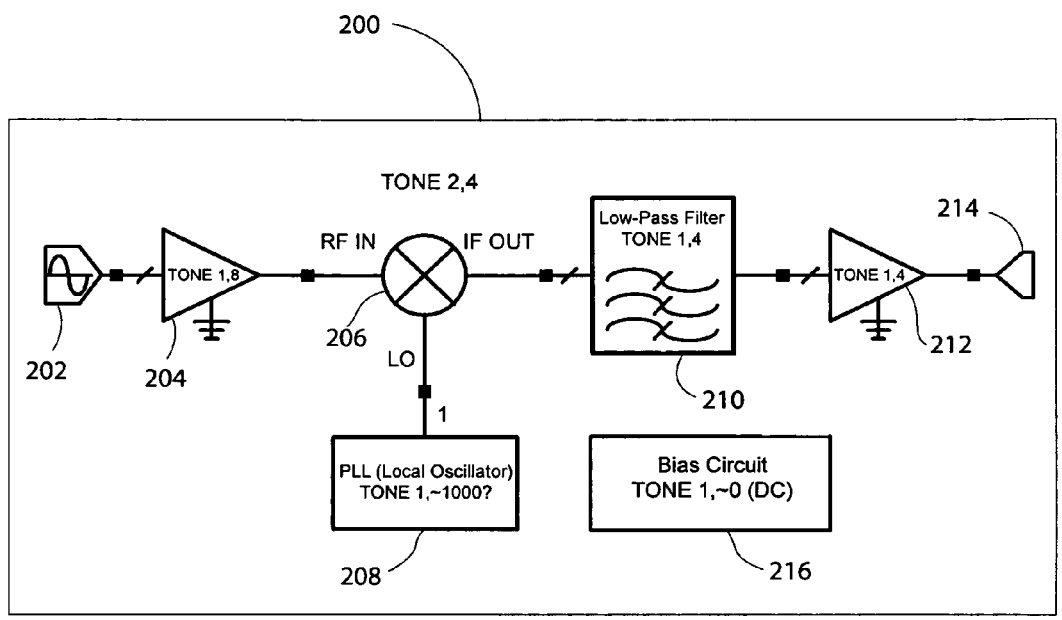
FIG. 2 is a block diagram of a simplified radio frequency ("RF") circuit diagram.

FIG. 2 is a circuit diagram illustrating a typical radio frequency (RF) circuit 200. FIG. 2 is a simple circuit that may be used as an example for analysis by the simulator described in FIG. 1. An RF input signal 202 is input into an amplifier 204 having a tone 1,8 characteristic. The RF input signal is mixed by mixer 206 with a signal from a local oscillator, typically a phased lock loop (PLL) 208 having a large number of harmonics. The presence of the mixer 206 ensures that at least a two tone simulation is capable of being performed on the circuit 200.

The PLL 208 may have one frequency generated but can have a number of harmonics such as a 1, 1024 representation comprising one frequency and 1024 harmonics. The output signal from the mixer 206 is an intermediate frequency ("IF") that is passed to a low pass filter 210 having a tone 1,4. The output of the low pass filter 210 is then passed to a second amplifier 212 having a tone 1,4. The output signal of the amplifier 210 is the IF output signal 214. A bias circuit 216 having a tone 1,~0 (DC) is typically generated from the DC source.

Circuit designers often employ simulations during circuit design to test functionality as well as performance methodologies. Using multi-rate harmonic balance analysis enables the simulation of larger circuits as well as the usage of a larger number of harmonics. Thus, three objectives can be achieved. First, each circuit block or circuit element may have a private set of analysis frequencies. Second, the current flows that from one block to another block is done at frequencies that are common to both blocks. Third, the number of fundamental tones or harmonics need not be the same for all the blocks. This is evident in FIG. 2 by the RF amplifier 216 having a tone of 1,8 and the mixer 220 having a tone of 2,4.

When performing a simulation on a computer, certain modifications are typically made for a multi-rate harmonic balance analysis simulation. The user performing a simulation may define as many frequency sets as needed for the simulation. For each block in the simulation, the user may select a diamond, box, box and diamond frequency truncation, or a numerical estimation of subsequent reduction of equation error all of which may be independent of the other blocks in the simulation. The user may specify the circuit elements by the block number. The parameter block specified may be automatically passed to all the elements inside the simulation model and only the top level block parameters may be used.

For a multi-rate harmonic balance analysis, the simulation may determine the analysis frequencies from the union of all the block frequencies. These frequencies are typically computed symbolically based on the block tone definition (0, f1, f2, 2f1, . . . ) and not by their numerical values.

Figure 3:
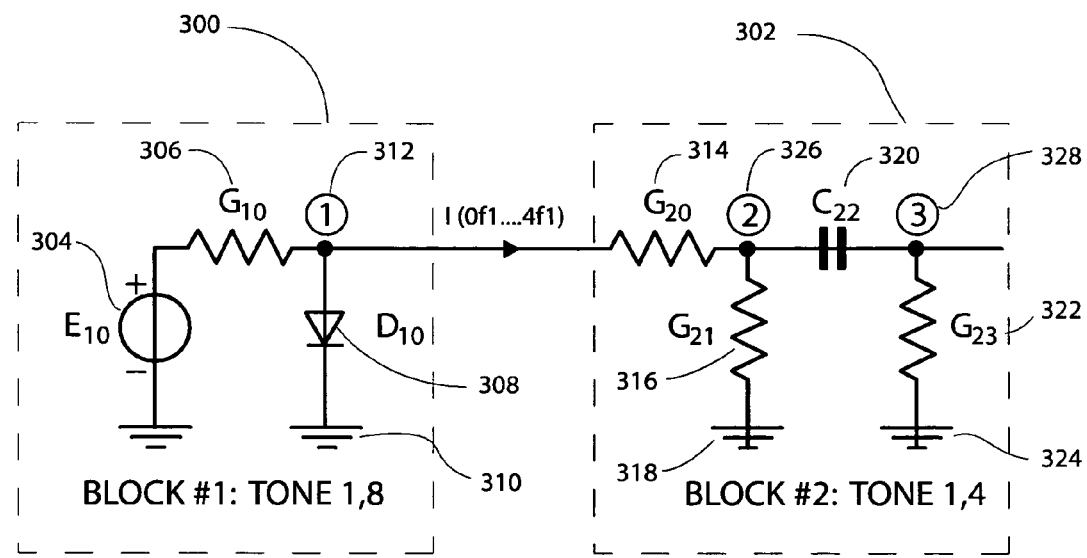
FIG. 3 is a circuit diagram of a two block simplified RF circuit diagram.

FIG. 3 is a circuit diagram illustrating a two block circuit. The first block 300 has a tone 1,8 and frequencies 0, f1, 2f1, 3f1, . . . 7f1, 8f1. The second block 302 has a tone 1,4 and frequencies 0, f1, 2f1, 3f1, 4f1. The first block 300 comprises a DC potential 304, a first resistor 306 and a diode 308 connected to a ground 310. Node 312 located between the first resistor 306 and the diode 308 is connected to a resistor 314 that is a part of the second block 302.

The second block 302 comprises a second resistor 314, a third resistor 316 that is in turn connected to a ground 318, a capacitor 320, a fourth resistor 322 and a ground 324. A second node 326 is located between the second resistor 314 and the third resistor 318 and connects to the capacitor 322. A third node 328 is located between the capacitor 320 and the fourth resistor 322. The three nodes 312, 326 and 328 represent the locations where in the circuit where the frequencies are examined.

The DC potential 304 may also include some sinusoidal excitation otherwise there may not be a need for a harmonic balance in the circuit. Hence, the only non-linear element in the sample circuit is the diode 308. Also, without the presence of the diode 308, there would not be the need for a harmonic balance analysis because the circuit would be linear. In a linear system there is no need for analysis of the voltage spectrum because the non-linearities transform the signal from one frequency to another.

Figure 4:
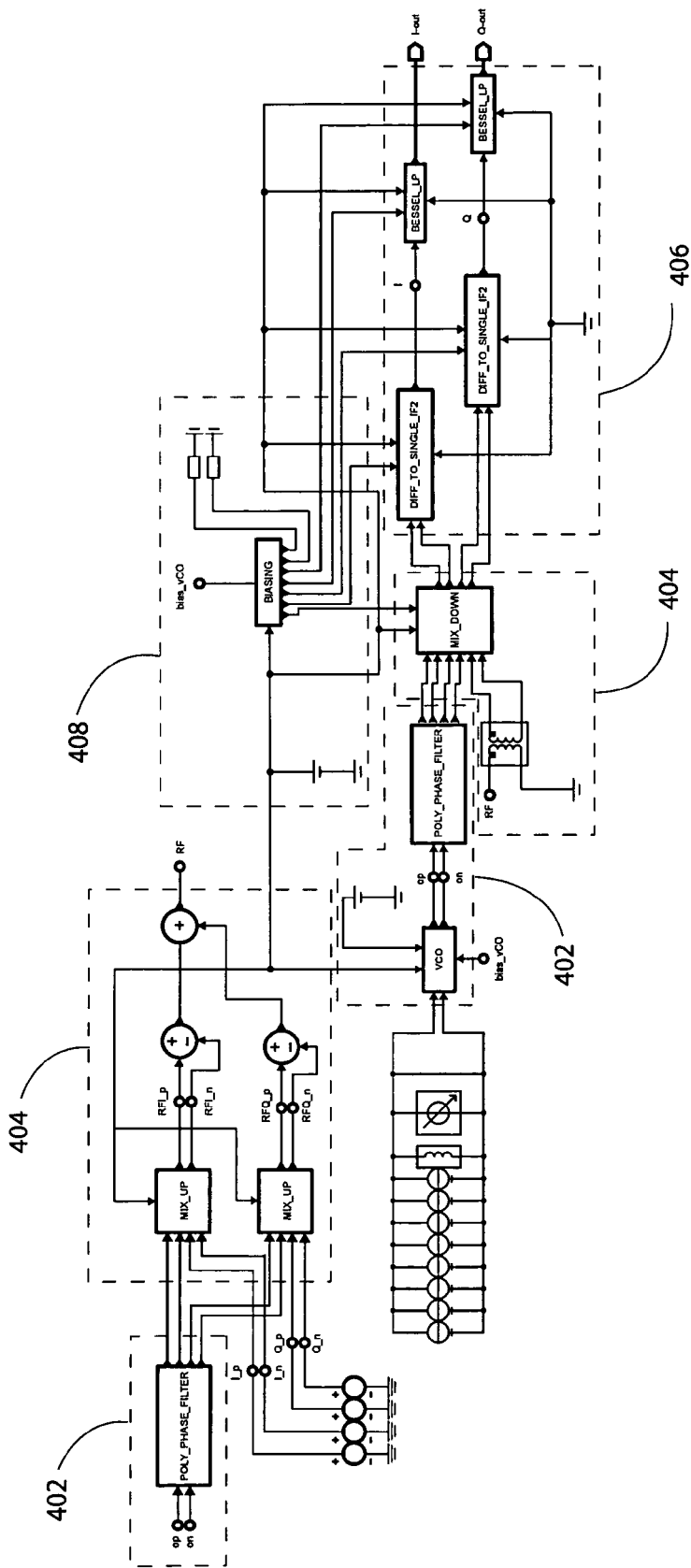
FIG. 4 is a circuit diagram of a QPSK circuit diagram showing a modulator/demodulator as the QPSK circuit diagram is divided into four blocks.

FIG. 4 is a circuit diagram of a four block Quadrature Phase Shift Keying ("QPSK") modulator/demodulator. The circuit 400 is divided into four blocks 402, 404, 406 and 408. The first block 402 comprises the polyphase filter and the Voltage Controlled Oscillator ("VCO") having eight transistors (8×BSIM3). The second block 404 comprises the mixup and mixdown sub-circuits having thirty-two transistors (32× BSIM3). The third block 406 comprises the DIFF_TO_SINGLE, with a Bessel low pass filter and has one hundred fourteen transistors (114×BSIM3). The fourth block 408 comprises the bias circuit and has thirty-four transistors (34× BSIM3) where the BSIM3 is a standard semiconductor nomenclature by the BSIM Research Group of the University of California at Berkeley for indicating the size of the circuit.

Figure 5:
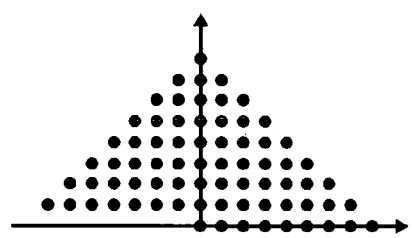
FIG. 5 is a signal constellation pattern having one fundamental frequency and seventy-two (72) harmonic frequencies.
Figure 6:
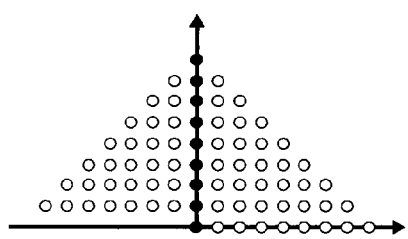
FIG. 6 is a signal constellation pattern having one fundamental frequency and eight (8) harmonic frequencies.
Figure 7:
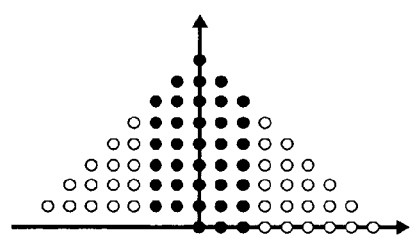
FIG. 7 is a signal constellation pattern having one fundamental frequency of thirty-six (36) harmonic frequencies.

FIG. 4 is divided into four blocks 402, 404, 406 and 408 meaning that there are four frequency sets identified. The frequency sets may be truncated as illustrated in FIGS. 5 through 7. In FIG. 5, two fundamental frequencies are present in a diamond truncation, thus there exists a DC frequency plus seventy-two harmonics for a total of seventy-three frequencies. In FIG. 5, the tone 2,8 represents two excitations and eight harmonic frequencies. FIG. 6 represents one fundamental frequency plus nine harmonic frequencies.

For large circuits in RF integrated circuit design typical to use a box and diamond truncation as illustrated in FIG. 7. In FIG. 7, both a diamond and box truncation is shown with a box 2,8 and diamond 8,2 truncation producing thirty-seven frequencies (DC plus 36 harmonic frequencies). Typically, a box and diamond truncation provides a respectable number of frequencies but does not excluding any important frequencies.

Table 1 illustrates values for a multi-rate harmonic balance simulation having voltage spectrum V(1), V(2) and V(3) from the nodes 312, 326 and 328 of FIG. 3. The table has values for the voltage spectrum for the zero DC frequency and fundamental frequencies of f1, 2f1, 3f1, 4f1, 5f1, 6f1, 7f1 and 8f1. The voltage spectrum for the fundamental frequencies 5f1, 6f1, 7f1 and 8f1 are zero for nodes 326 and 328 because in the second block 302 the block is defined as having frequencies 0 and fundamental frequencies f1, 2f1, 3f1 and 4f1 (tone 1,4). Please note, in a harmonic balance analysis the zero DC frequency is not the same as the DC solution for the circuit but due to the mixing there may be some contribution to the DC level of the circuit.

TABLE 1

| Freq. | V(1) | V(2) | V(3) |
|---|---|---|---|
| 0 | (279.696 m, 0.000) | (276.927 m, 0.000) | (0.000, 0.000) |
| f1 | (71.065 m, −17.540 m) | (69.501 m, −17.500 m) | (65.187 m, 10.166 m) |

TABLE 1-continued

| Freq. | V(1) | V(2) | V(3) |
|---|---|---|---|
| 2f1 | (127.286 m, −60.396 m) | (124.296 m, −59.381 m) | (130.998 m, −31.582 m) |
| 3f1 | (−6.516 m, 22.335 m) | (−6.330 m, 21.843 m) | (−9.235 m, 20.536 m) |
| 4f1 | (−893.202 u, 13.427 m) | (−855.018 u, 13.124 m) | (−2.223 m, 12.888 m) |
| 5f1 | (−868.746 u, 4.174 m) | (0.000, 0.000) | (0.000, 0.000) |
| 6f1 | (−1.284 m, 1.383 m) | (0.000, 0.000) | (0.000, 0.000) |
| 7f1 | (−2.779 m, 447.492 u) | (0.000, 0.000) | (0.000, 0.000) |
| 8f1 | (−2.000 m, −384.839 u) | (0.000, 0.000) | (0.000, 0.000) |

TABLE 2

| | Multi-Rate Harmonic Balance | | | |
|---|---|---|---|---|
| HB Analysis Tone | Block 1* 8, 3 Block 2 Block 3* 2, 8 Block 4 | Tone Block 1* 8, 3 Block 2 Block 3* 3, 8 Block 4 | Tone Block 1* 8, 2 Block 2 Block 3* 2, 8 Block 4 | Tone Block 1* 8, 1 Block 2 Block 3* 1, 8 Block 4 |
| CPU [S] | 69 | 58 | 48 | 38 |
| MEM [Kbytes] | 138 | 131 | 117 | 102 |
| HB Analysis | 9 | 9 | 9 | 8 |
| Function Calls (1e6) | 10.1 | 8.5 | 6.9 | 5.1 |
| GMRES Iterations | 21 | 21 | 21 | 20 |
| Internal | 339 | 339 | 338 | 335 |

*Using Tone 2, 8 Box and Diamond

Table 2 illustrates the CPU and memory allocation for the number of harmonic balance analysis calculations for a two tone analysis. The number of function calls and the number of General Minimized Residuals ("GMRES") iterations and internal iterations to obtain the solution are listed. The GMRES is a reference number indicating how well the analysis is performing in a non-linear circuit. If the numbers are large relative to the circuit size, the data still helps a user compare the performance analysis of the simulation.

Table 2 illustrates values from a box and diamond truncation simulation on a two tone analysis. Here, the box size is reduced so that eventually there is only one harmonic component. The three columns on the right of the table represent a reduction from 8,3 to 3,8; 8,2 to 2,8; and 8,1 to 1,8. In each example, the harmonic balance analysis indicates that the results are consistent.

Figure 8:
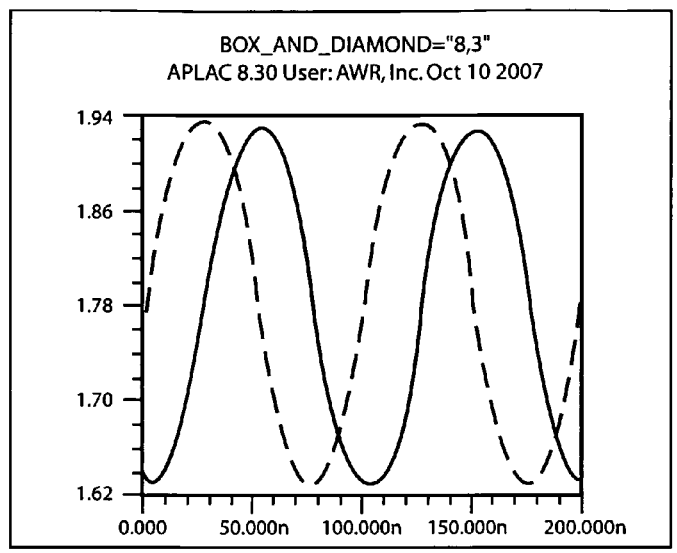
FIG. 8 is a graph illustrating a time domain plot of a box and diamond tone 8,3 with time plotted in the x-axis and dB in the y axis.
Figure 9:
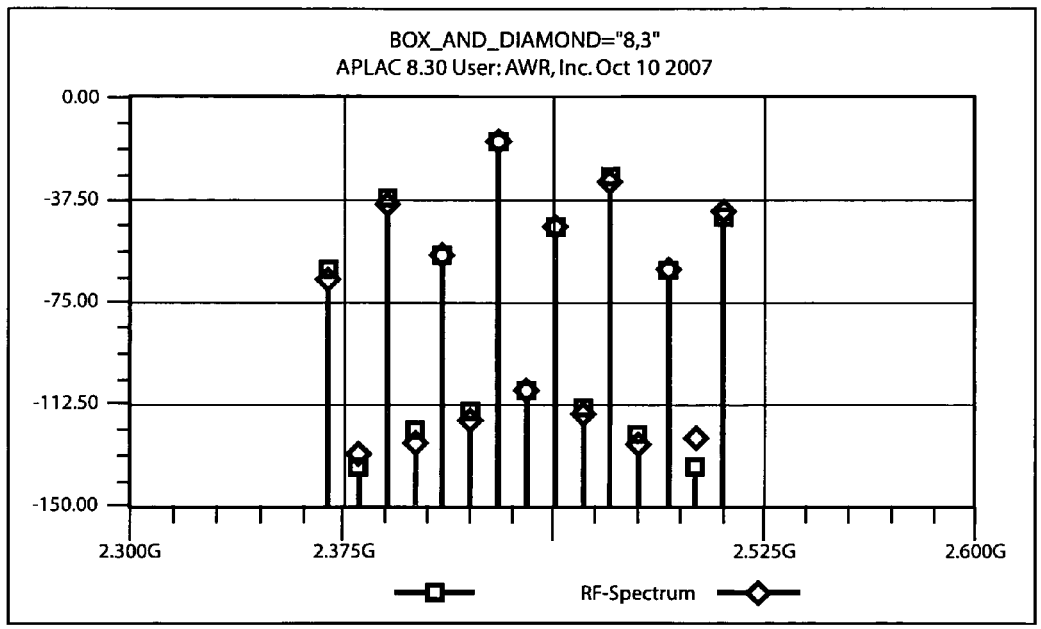
FIG. 9 is a graph illustrating a frequency domain plot of a box and diamond tone 8,3 with frequency in the x-axis and dB in the y axis.
Figure 10:
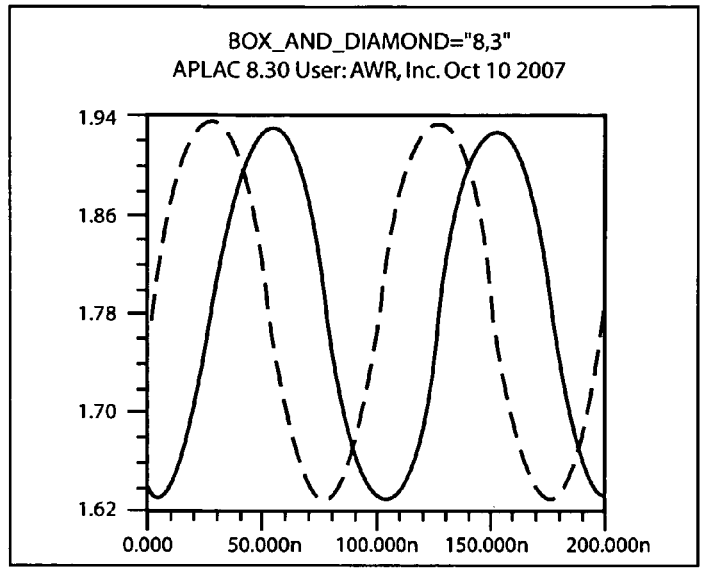
FIG. 10 is a graph illustrating a time domain plot of a box and diamond tone 8,3 with time plotted in the x-axis and dB in the y axis.
Figure 11:
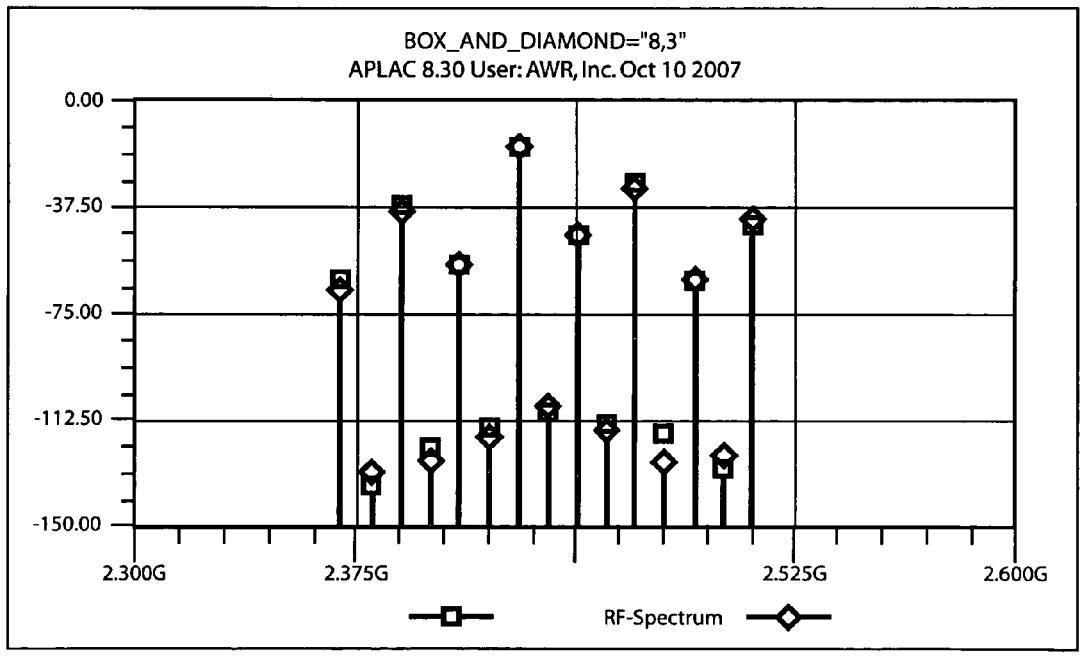
FIG. 11 is a graph illustrating a frequency domain plot of a box and diamond tone 8,3 with frequency in the x-axis and dB in the y axis.

FIGS. 8, 9, 10 and 11 represent the analysis results from the circuit presented in FIG. 4. FIGS. 8 and 9 represent time domain waveforms from nodes I_out and Q_out and a frequency domain spectrum from node RF. There are two simulation results in each graph, one obtained with traditional HB analysis and one with frequency selection specified to be BOX_AND_DIAMOND="8,3". In FIGS. 10 and 11 the same data is presented with a frequency selection of BOX_AND_DIAMOND="8,2" instead of "8,3".

Figure 12:
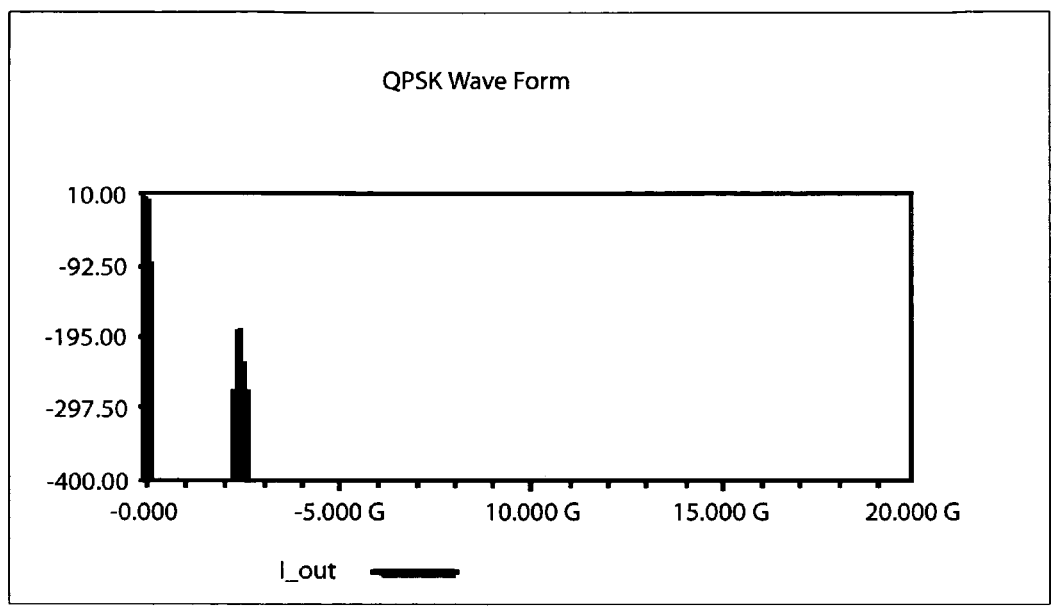
FIG. 12 is a graph illustrating a QPSK waveform in the frequency domain.
Figure 13:
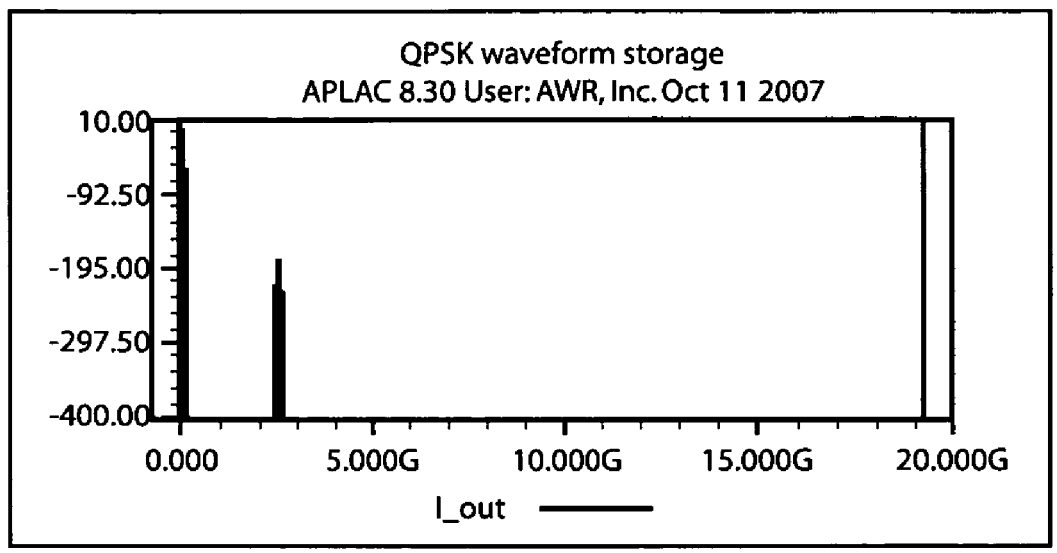
FIG. 13 is a graph illustrating a QPSK waveform in the frequency domain.

FIGS. 12 through 15 are taken from the same node in the circuit. FIGS. 12 and 13 illustrate the values taken in the analysis of a node. In FIG. 12, the frequency content is illustrated from 0 Hz to 20 Gigahertz where DC is at the zero frequency (0 Hz) and then eight frequency groupings because the analysis was performed at tone 1,8 representing eight harmonic frequency components. In FIG. 13, there is only one harmonic component so there is only one group of frequencies plotted. There are small differences at −100 dB, the spectrums do not completely overlap which is acceptable at these voltage levels, but an overall analysis show that the groupings are very similar.

Figure 14:
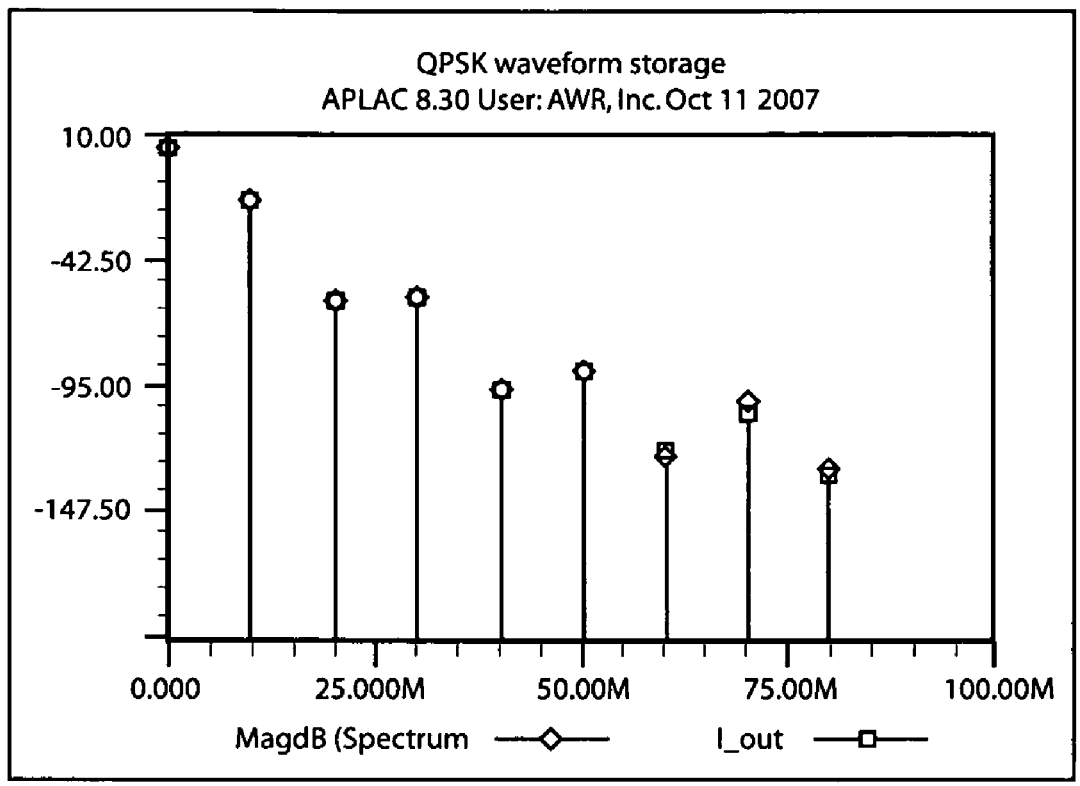
FIG. 14 is a graph illustrating a QPSK waveform in the frequency domain.
Figure 15:
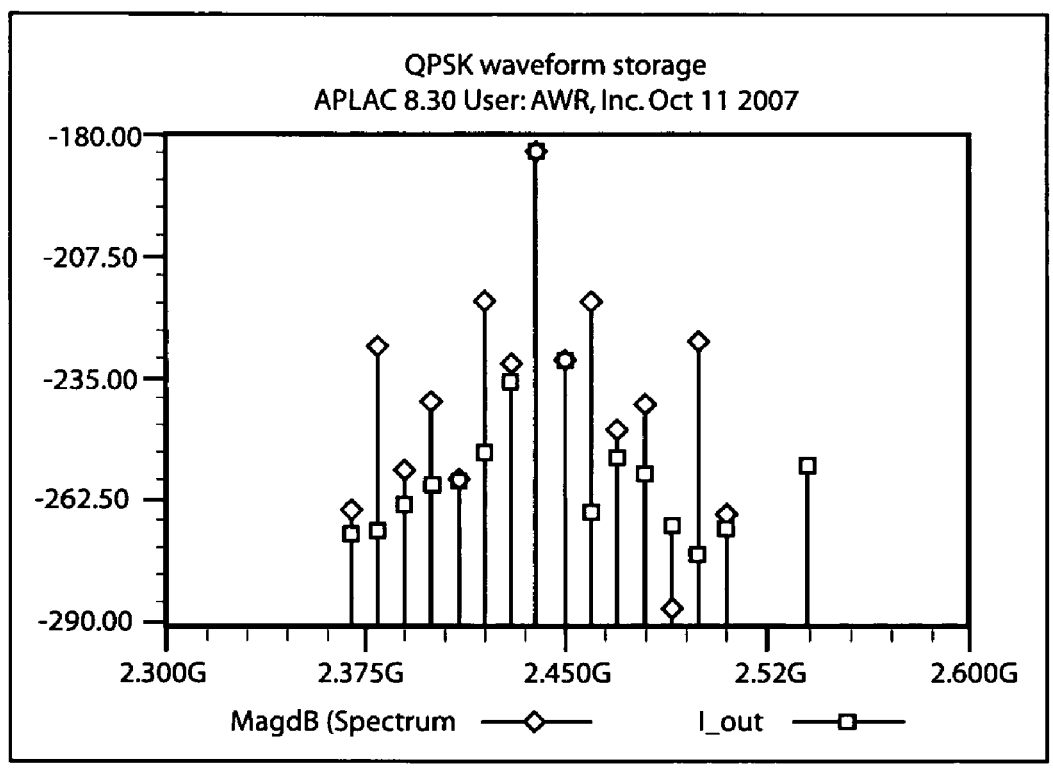
FIG. 15 is a graph illustrating a QPSK waveform in the frequency domain.

FIGS. 14 and 15 represent the analysis results from the same node using multi-rate harmonic balance analysis and the traditional HB analysis. In FIG. 14 the spectrum near DC is shown where as in FIG. 15 the spectrum is near 2.45 GHz. In FIG. 15, the frequencies in the center are overlapping but the harmonic frequencies are not. These results are not overlapping except at −110 dB. In this part of the circuit, there are not that many significant frequencies. So the assumption of taking away the seven other harmonic frequencies are so small that removing them from the analysis did not negatively affect the results.

FIGS. 12 through 15 illustrate that the multi-rate harmonic balance closely approximates a harmonic balance simulation, but with the reduced number of harmonic frequencies, the analysis requires far less computational power to complete the circuit simulation.

While various embodiments of the invention have been described, it will be apparent to those of ordinary skill in the art that many more embodiments and implementations are possible that are within the scope of this invention.

What is claimed is:

1. A method for obtaining steady state values of a circuit design, comprising:
   utilizing a computer to perform:
   automatically identifying a plurality of circuit blocks in the circuit design;
   selecting at least a subset of the plurality of circuit blocks;
   generating circuit equations based on the selected subset, wherein the circuit equations comprise at least one nonlinear equation;
   for a first circuit block of the subset, specifying a first set of frequencies;
   for a second circuit block of the subset, specifying a second set of frequencies, wherein the first set of frequencies differs from the second set of frequencies by at least one frequency;
   solving the circuit equations for the first and second set of frequencies to obtain at least one steady state value.

2. The method of claim 1, wherein said generating the circuit equations based on the selected subset comprises generating a first set of equations for the first circuit block of the subset and generating a second set of equations for the second circuit block of the subset, wherein the first set of equations is different from the second set of equations.

3. The method of claim 1, wherein said selecting the at least the subset of the plurality of circuit blocks is performed in response to user input.

4. The method of claim 1, further comprising:
   utilizing the computer to perform:
   refining the at least a subset of circuit blocks, wherein said refining is performed by trading off speed of said solving the circuit equations with memory consumption.

5. The method of claim 1, wherein the at least one steady state value is for current.

6. The method of claim 1, wherein the at least one steady state value is for voltage.

7. The method of claim 1, wherein the at least one steady state value is for power.

8. The method of claim 1, wherein said solving the circuit equations produces a Jacobian matrix that includes information on current derivatives at the location of at least one node in the circuit design.

9. The method of claim 1, further comprising:
   utilizing the computer to perform:
   multiplying nonlinear parameters of a block's characteristics to describe a block.

10. The method of claim 1, wherein said selecting the at least a subset of the plurality of circuit blocks comprises using a frequency selection tool.

11. The method of claim 1, wherein said selecting the at least a subset of the plurality of circuit blocks comprises selecting initial values in response to user input.

12. The method of claim 1, wherein said selecting the at least a subset of the plurality of circuit blocks comprises selecting initial values by using a result from a previous simulation.

13. The method of claim 1, wherein said selecting the at least a subset of the plurality of circuit blocks is performed automatically based on error estimation during an iterative process.

14. The method of claim 1, wherein said selecting the at least a subset of the plurality of circuit blocks comprises selecting initial values by oversampling nonlinear elements of at least one desired frequency.

15. The method of claim 14, further comprising:
   utilizing the computer to perform:
   using harmonic balance to select the at least one desired frequency.

16. The method of claim 14, further comprising:
   utilizing the computer to perform:
   using frequency domain steady state to select the at least one desired frequency.

17. The method of claim 1, wherein said specifying the first set of frequencies comprises specifying at least one frequency harmonic.

18. The method of claim 16, wherein said specifying the at least one frequency harmonic comprises using a box truncation.

19. The method of claim 17, wherein said specifying the at least one frequency harmonic comprises using a diamond truncation.

20. The method of claim 17, wherein said specifying the at least one frequency harmonic comprises using numerical estimation of subsequent reduction of equation error.

21. A non-transitory, computer-accessible memory medium storing program instructions for obtaining steady state values of a circuit design, wherein the program instructions are executable to:
   automatically identify a plurality of circuit blocks in the circuit design;
   select at least a subset of the plurality of circuit blocks;
   generate circuit equations based on the selected subset, wherein the circuit equations comprise at least one nonlinear equation;
   for a first circuit block of the subset, specify a first set of frequencies;
   for a second circuit block of the subset, specify a second set of frequencies, wherein the first set of frequencies differs from the second set of frequencies by at least one frequency;
   solve the circuit equations for the first and second set of frequencies to obtain at least one steady state value.

22. The non-transitory, computer accessible memory medium of claim 21, wherein said generating the circuit equations based on the selected subset comprises generating a first set of equations for the first circuit block of the subset and generating a second set of equations for the second circuit block of the subset, wherein the first set of equations is different from the second set of equations.

23. The non-transitory, computer accessible memory medium of claim 21, wherein said selecting the at least the subset of the plurality of circuit blocks is performed in response to user input.

24. The non-transitory, computer accessible memory medium of claim 21, wherein the at least one steady state value is for current.

25. The non-transitory, computer accessible memory medium of claim 21, wherein the at least one steady state value is for voltage.

26. The non-transitory, computer accessible memory medium of claim 21, wherein the at least one steady state value is for power.

27. The non-transitory, computer accessible memory medium of claim 21, wherein said solving the circuit equations produces a Jacobian matrix that includes information on current derivatives at the location of at least one node in the circuit design.

28. The non-transitory, computer accessible memory medium of claim 21, wherein said selecting the at least a subset of the plurality of circuit blocks comprises selecting initial values in response to user input.

29. The non-transitory, computer accessible memory medium of claim 21, wherein said selecting the at least a subset of the plurality of circuit blocks comprises selecting initial values by using a result from a previous simulation.

30. The non-transitory, computer accessible memory medium of claim 21, wherein said selecting the at least a subset of the plurality of circuit blocks comprises selecting initial values by oversampling nonlinear elements of at least one desired frequency.

31. The non-transitory, computer accessible memory medium of claim 21, wherein said specifying the first set of frequencies comprises specifying at least one frequency harmonic.

32. The non-transitory, computer accessible memory medium of claim 31, wherein said specifying the at least one frequency harmonic comprises using a box truncation.

33. The non-transitory, computer accessible memory medium of claim 31, wherein said specifying the at least one frequency harmonic comprises using a diamond truncation.

* * * * *